United States Patent
Imran et al.

(10) Patent No.: US 10,151,220 B2
(45) Date of Patent: Dec. 11, 2018

(54) SYSTEM FOR THERMOELECTRIC ENERGY GENERATION USING NATURAL GAS

(75) Inventors: Mir A. Imran, Los Altos Hills, CA (US); Matthew Harrison, Boerne, TX (US)

(73) Assignee: InCube Labs, LLC, San Jose, CA (US)

( * ) Notice: Subject to any disclaimer, the term of this patent is extended or adjusted under 35 U.S.C. 154(b) by 355 days.

(21) Appl. No.: 13/586,828

(22) Filed: Aug. 15, 2012

(65) Prior Publication Data

US 2013/0205780 A1    Aug. 15, 2013

Related U.S. Application Data

(60) Provisional application No. 61/523,828, filed on Aug. 15, 2011.

(51) Int. Cl.
*F01K 21/00* (2006.01)
*H01L 35/30* (2006.01)
*H02J 7/34* (2006.01)

(52) U.S. Cl.
CPC ............... *F01K 21/00* (2013.01); *H01L 35/30* (2013.01); *H02J 7/34* (2013.01)

(58) Field of Classification Search
CPC .......... F01K 15/04; F01K 21/00; F01K 25/02; H01L 35/30; H01L 35/00; H02J 7/34;

(Continued)

(56) References Cited

U.S. PATENT DOCUMENTS

| 4,434,613 A | 3/1984 | Stahl |
| 4,734,139 A | 3/1988 | Shakun |

(Continued)

FOREIGN PATENT DOCUMENTS

| EP | 1255340 A1 | 11/2004 |
| GB | 2402001 A | 11/2004 |

(Continued)

OTHER PUBLICATIONS

Qiu et al. "Development of a thermoelectric self-powered residential heating system", Journal of Power Sources, Elsevier SA, CH, vol. 180, No. 2, Jun. 1, 2008.

(Continued)

*Primary Examiner* — Mark Laurenzi
*Assistant Examiner* — Paul Thiede
(74) *Attorney, Agent, or Firm* — Mahamedi IP Law LLP; Joel Harris (57) ABSTRACT

Embodiments of the invention provide methods and apparatus for using a controllable heat source to generate electricity. One embodiment provides an energy generation module comprising a controllable heat source, one or more jackets of thermoelectric devices, and heat conducting fluids surrounding or otherwise thermally coupled to the jackets. The energy generation module can be used to convert heat from a heat source such as a gas combustion chamber into electricity. Embodiments of the invention are particularly useful for generating electricity when electrical power is not existent, cost prohibitive or otherwise in short supply. The generated electricity can be used by the user, stored in an electrical storage battery or sold to a local or remote power grid.

8 Claims, 4 Drawing Sheets

(58) Field of Classification Search
CPC ........... F23C 13/00; F23C 2900/03001; F23M 2900/13003; F23M 99/00; Y02T 10/166
USPC ................. 60/643, 645, 646, 651, 722, 776; 136/204, 205
See application file for complete search history.

(56) References Cited

U.S. PATENT DOCUMENTS

| | | | |
|---|---|---|---|
| 6,192,687 B1* | 2/2001 | Pinkerton et al. | 60/646 |
| 6,198,038 B1 | 3/2001 | Shukla | |
| 6,236,810 B1 | 5/2001 | Kadotani | |
| 6,987,329 B1 | 1/2006 | Smith et al. | |
| 7,317,265 B2 | 1/2008 | Chain et al. | |
| 7,493,766 B2 | 2/2009 | Yang et al. | |
| 2003/0223919 A1* | 12/2003 | Kwak | B01D 53/9445 422/174 |
| 2004/0089336 A1* | 5/2004 | Hunt | H01L 35/30 136/205 |
| 2004/0099304 A1 | 5/2004 | Cox | |
| 2006/0066106 A1 | 3/2006 | Yang et al. | |
| 2006/0266043 A1* | 11/2006 | Jerome | F01K 15/04 60/651 |
| 2007/0044468 A1 | 3/2007 | Ziph | |
| 2007/0261729 A1 | 11/2007 | Hu | |
| 2009/0007953 A1 | 1/2009 | Hsu | |
| 2009/0301539 A1 | 12/2009 | Watts | |
| 2009/0301687 A1 | 12/2009 | Watts | |
| 2011/0067742 A1* | 3/2011 | Bell | F01N 3/043 136/204 |
| 2011/0077811 A1 | 3/2011 | Karimi et al. | |
| 2011/0283712 A1* | 11/2011 | Brillet | B64D 41/00 60/801 |
| 2014/0020730 A1* | 1/2014 | Imran | H01L 35/30 136/205 |

FOREIGN PATENT DOCUMENTS

| | | |
|---|---|---|
| JP | 2003-235158 | 2/2002 |
| JP | 2009-267316 | 11/2009 |
| WO | WO 2010/089505 | 8/2010 |

OTHER PUBLICATIONS

Qiu et al. "A Natural-Gas-Fired Thermoelectric Power Generation System", Journal of Electronic Materials, vol. 38, No. 7, Jul. 1, 2009.
Supplemental EP Search Report and Notice thereof dated Nov. 17, 2014 in EP Application No. 12823819.3.
International Search Report, Written Opinion and Notice dated Dec. 27, 2012 in PCT Application PCT/US2012/051010.
Office Action in JP2014-526188 dated May 31, 2016.

* cited by examiner

SYSTEM FOR THERMOELECTRIC ENERGY GENERATION USING NATURAL GAS

PRIORITY CLAIM

This application claims the benefit of priority to Provisional U.S. Patent Application No. 61/523,828, entitled "SYSTEM AND METHOD FOR THERMOELECTRIC ENERGY GENERATION", filed Aug. 15, 2011; the aforementioned priority application being hereby incorporated by reference for all purposes.

TECHNICAL FIELD

Embodiments described herein relate to thermoelectric energy generation. More particularly, embodiments described herein related to a system and apparatus for generating electricity from a heat source. Still more particularly, embodiments described herein related to a system and apparatus for controlling electricity generation from a heat source.

BACKGROUND

Thermal energy is one of the most common forms of energy existing in the nature and may result from process such as combustion. Heat is a form of thermal energy which results from the transfer of thermal energy from a system having a higher temperature to a system having a lower temperature. Thermoelectric generators (TEGs), or thermoelectric devices, are devices that are capable of directly converting heat into electricity. TEG modules, which can be in the form of strip, can be attached to stoves, fireplaces, or a furnace to harvest thermal energy for providing electricity as a supplement or an alternative source. Current TEG strips have somewhat helped to alleviate heat wasting by converting the waste heat into electricity; however, current applications of TEG are rudimentary and not fully effective. Their efficiency is subject to various environmental settings, In North America it is common to use natural gas to generate hot water and/or hot air for domestic uses. In fact, nearly 70 percent of single family homes use natural gas for heating purposes. Besides being abundant, natural gas has an advantage over petroleum or coal, as natural gas burns cleanly without producing harmful chemicals like sulfur dioxide or nitrogen oxide into the air. Although natural gas and electricity in a given local area are regularly provided by the same energy company, they are typically sold and delivered to households as two separate products using two separate delivery infrastructures (e.g., power lines vs. gas lines). The inability of end customers to easily convert one product into another results in waste. Therefore, it is beneficial to enable a user to selectively generate electricity from a controllable heat source.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Various embodiments of the invention provide a method and apparatus for using a controllable heat source to generate electricity. Many embodiments provide an energy generation module comprising a controllable heat source, one or more jackets of thermoelectric devices, and heat conducting fluids. The fluids are configured and positioned to conduct heat from and/or to the jackets and may be placed to surround all or a portion of the jackets and/or or to lie in between the jackets. The jackets of thermoelectric devices can be configured to be watertight so as to contain the fluids, or one or more sleeve-type enclosures can be used to contain the fluids. The sleeve-type enclosures can be made from materials with high heat conductivity and the jackets of thermoelectric devices may be coupled to the sleeve-type enclosures. The energy generation module can convert heat, for example, from a gas combustion chamber (also described as a combustor), into electricity. According to other embodiments, an energy generation system having one or more energy generation modules, a direct current to alternate current (DC-to-AC) converter, and a control module are provided to selectively generate electricity based, at least in part, on load demand and a supply condition(s) of the local power grid. According to yet another embodiment, a method for generating electricity using an energy generation system having a plurality of energy generation modules with controllable heat sources is disclosed to selectively generate electricity based at least in part on load demand and supply condition of the local power grid.

Embodiments of invention described herein can enable a user, such as an individual home owner, to generate electricity with high efficiency from a controllable heat source, for example, a natural gas combustor. In the following description, numerous specific details are set forth in order to provide a thorough understanding of the embodiments. It will be apparent, however, that the embodiments may be practiced without these specific details. In other instances, well-known structures and devices are shown in block diagram form to avoid unnecessarily obscuring the exemplary embodiments described herein.

Figure 1:
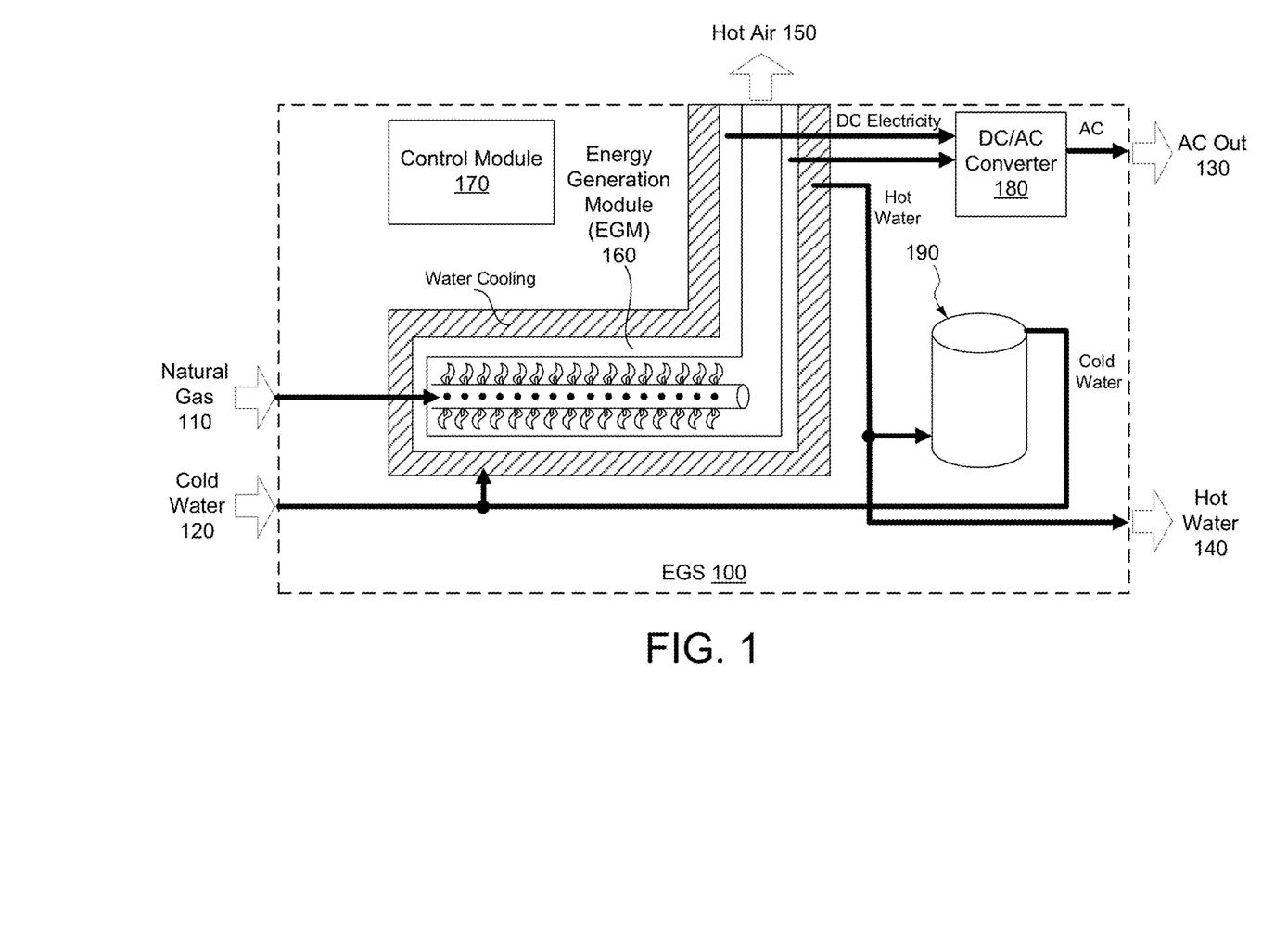
FIG. 1 illustrates one embodiment of an energy generation system.

FIG. 1 illustrates one embodiment of an energy generation system 100. The energy generation system 100 includes a natural gas input 110, a cold water input 120, an electricity output 130, a hot water output 140, and an exhaust output 150. The energy generation system 100 also includes one or more thermoelectric energy generation modules (EGMs) 160, a control module 170, a DC-to-AC converter 180, and a water cooler 190. The one or more EGMs are coupled to the natural gas input 110 and the cold water input 120. According to present embodiments, the energy generation system 100 can control the one or more EGMs 160 to convert heat from a controllable heat source (for example, by burning the natural gas supplied by the natural gas input 110), to electricity.

The EGM(s) 160 is coupled to the natural gas input 110 for fuel gas, and to the cold water input 120 for coolant. According to present embodiments, the EGM 160 includes a controllable heat source, at least a first jacket of thermoelectric devices (or thermoelectric generators, "TEGs") and at least a first heat conducting fluid contacting all or a portion of the outer side of the first jacket to create a temperature difference or gradient ($\Delta T$) over a portion of the jacket of thermoelectric devices. Typically, the temperature gradient will be between the inside wall of the jacket (the hot side) and the outside wall (the cool side). However, other configurations for the gradient ($\Delta T$) are also contemplated (e.g., inside wall is the cool side, outside wall is the cool side, etc.). Through the thermoelectric effect, the $\Delta T$ creates a voltage difference in the TEGs, and thereby the EGM 160 converts heat into electricity. The heat conducting fluid can be any kind of fluid capable of heat conducting well known in the art, for example, oil or water. Also, the heat conducting fluid (as well a heat conducting material described herein) can surround all or a portion of the outside wall of the jacket. The heat conductive fluid (and/or the heat conductive material) can be in direct contact with the jacket or otherwise thermally coupled to the jacket through indirect contact (e.g., via another thermally conductive material or structure) to allow for heat transfer to the heat conducting fluid. The controllable heat source can selectively generate heat in response to a control signal. Such control signal may be transmitted from the control module 170 of the energy control system 100. Structures of the embodiments of the EGM 160 are described in fuller detail below.

In the course of conversion, cold water supplied by the cold water input 120, is used as at least in part for the coolant for the EGMs. Hot water is produced as a by-product of the conversion, and is directed either to the hot water output 140 for further use or to the water cooler 190 to be cooled and redirected to the EGM 160 for reuse as coolant. The water cooler 190 can be any kind of suitable cooler including, for example, a compressor driven cooler. Exhaust, as another by-product of the conversion, is directed to the exhaust output 150 to be released into the atmosphere. Because the process of burning natural gas typically does not produce any harmful chemicals, it is safe to release the exhaust into the atmosphere. In some embodiments, the exhaust can be used as a heat source for heating purposes, for example, for heating hot water. In still other embodiments carbon dioxide ($CO_2$) from the exhaust can be filtered out using lithium hydroxide or other ($CO_2$)-sorbent material known in the art such as various zeolite materials.

The main product of the conversion is electricity, which typically is in the form of direct current. The electricity is directed from the EGM 160 to the DC-to-AC converter 180 to become alternate current, and is then directed to the electricity output 130. In some other embodiments, the direct current can be directed to the electricity output 130, and the DC-to-AC converter 180 can be omitted. Additionally other electrical devices 180 can be employed to modify electricity output 130. Such electrical devices can include for example, a transformer to step up or step down the voltage of output 130 for power transmission to a local power grid (e.g., up to 10 to 20 miles (16.09 to 32.19 kilometers) away) or a remote power grid (e.g., hundreds of miles away).

Figure 2A:
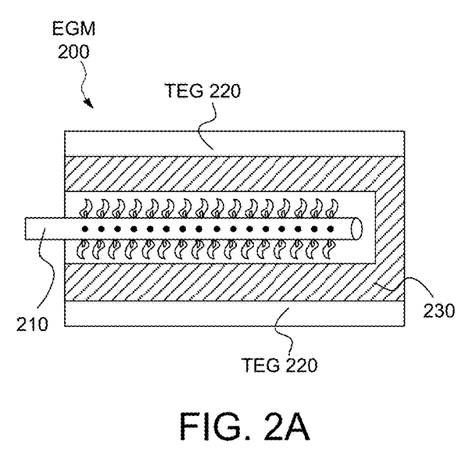
FIG. 2A illustrates a side view of one embodiment of an energy generation module.

FIG. 2A illustrates a side view of one embodiment 200 of an energy generation module (EGM). The EGM 200 includes a controllable heat source 210, a plurality of thermoelectric generators (TEGs) 220, and heat conducting layer 230. The controllable heat source 210 burns natural gas as fuel to create heat. The heat conducting layer 230 is placed in proximity to the controllable heat source 210 so as to as least partially surround the heat source 210, so that the heat from the controllable heat source 210 is efficiently transferred to the heat conducting layer 230. The heat conducting layer 230 can be filled with a heat conducting fluid, like oil or water (that is desirably sealed within layer 230), or can simply be a heat conducting material, (for example, copper) or can include a combination of heat conductive fluid and heat conducting material. In particular embodiments, the heat conducting layer 230 can have a corrugated or other textured surface so as to increase the surface area of layer 230 and thus, the amount/rate of heat transfer. The plurality of TEGs 220 form a jacket to surround all or a portion of the heat conducting layer 230, so that the inner side of the jacket of TEGs are heated. The heated inner side of the jacket of TEGs and the outer cooler side of the jacket of TEGs result in a temperature difference or gradient ($\Delta T$), which can be used to drive the TEGs to generate electricity. Also, the plurality of TEG's 220 can be substantially symmetrically distributed around the perimeter of heat conducting layer 230 and/or heat source 210, for example, having a spacing within 10, 5, 2, or 1 degrees apart. Various asymmetric distributions are also considered. Also in various embodiments, TEG's 220 can be distributed in a pattern whereby they are separated by thermally insulating wells as is discussed in greater detail herein.

Figure 2B:
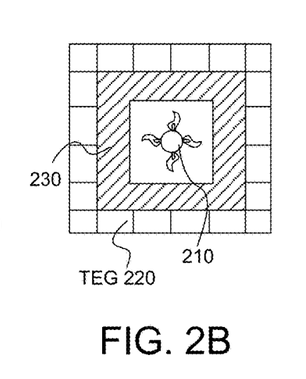
FIG. 2B illustrates a cross section view of the embodiment shown in FIG. 2A.

FIG. 2B illustrates a cross section view of the embodiment 200 shown in FIG. 2A. As illustrated in FIG. 2A, the heat conducting layer 230 and the jacket of the plurality of TEGs 220 are placed in proximity to the controllable heat source 210 so as to at least partially surround the heat source 210 for better conversion efficiency.

Figure 3A:
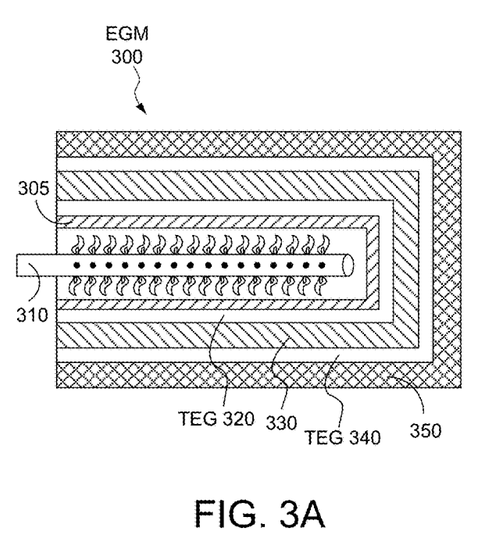
FIG. 3A illustrates a side view of another embodiment of an energy generation module.

FIG. 3A illustrates a side view of another embodiment 300 of an energy generation module (EGM). In this and related embodiments EGM 300 includes a controllable heat source 310, a first jacket of thermoelectric devices (TEGs) 320, a first heat conducting fluid 330, and optionally, a heat source housing 305. In some embodiments, the EGM 300 further includes a second jacket of TEGs 340, and a second heat conducting fluid 350 as is explained in more detail below. According to present embodiments, the controllable heat source 310 selectively generates heat in response to a control signal, which is generated by a control module such as control module 170 in FIG. 1.

The first jacket of TEGs 320 has an inner side and an outer side. The inner side of the first jacket 320 is placed in proximity to the controllable heat source 310 so as to at least partially surround the heat source 310 to absorb heat, for example, by conduction or other forms of heat transfer (e.g., convection, etc). The outer side of the first jacket 320 is surrounded by the first heat conducting fluid 330. The first heat conducting fluid 330 acts as coolant or heat dissipation agent, and thereby creates a temperature difference ($\Delta T$) between the inner and the outer side of the first jacket of TEGs 320, which in turn becomes the source of electricity generation. In one embodiment, the first heat conducting fluid 330 is oil. In other embodiments, the first heat conducting fluid 330 is water. Also various solutes can be added to water (e.g., salt) to increase its heat capacity.

In some embodiments, the second jacket of TEGs 340 is selected and positioned so as to more completely absorb the heat generated from the controllable heat source 310. In such embodiments, the second jacket of TEGs 340 is placed as enclosure for the first conducting fluid 330, so that the inner side of the second jacket 340 surrounds the first heat conducting fluid 330 and absorbs heat from fluid 330. The second heat conducting fluid 350 is also placed to surround the outer side of the second jacket 340 to cool down the outer side of the second jacket 340 and to create ΔT, so that the second jacket of TEGs 340 further generates electricity. The jackets of thermoelectric devices (e.g., TEGs 340) can be configured to be watertight so as to contain the fluids, or one or more sleeve-type enclosures can be used to contain the fluids. The sleeve-type enclosures can be made from materials with high heat conductivity and the jackets of thermoelectric devices (e.g., TEGs 340) may be coupled to the sleeve-type enclosures.

In various embodiments employing a first and a second jacket of TEGs 320 and 340, a series of heat conducting conduits (not shown) can be thermally coupled to one or both of jackets 320 and 340 (either directly or indirectly) so as to concentrate or otherwise enhance heat transfer between jackets 320 and 340. The heat conducting conduits can be used alone or in combination with heat transfer fluid 330. In particular embodiments, the heat conducting conduits can comprise various heat conducting metals known in the art and/or high heat capacity liquids (e.g. oil, water or salt water). In various embodiments, one or both of energy generating jackets 320 and 340 can have a rectangular or a cylindrical shape configured to enhance heat transfer from one or more of i) heat source 310 to first heat conducting fluid 330 and first jacket 320; ii) first heat conducting fluid 330 and second jacket 340; and iii) between second jacket 340 and second heat conducting fluid 350. Other shapes are also considered for enhancing heat transfer between one or more of the above elements. Additionally, one or both of jackets 320 and 340 can have a corrugated, ribbed or other textured surface (either inside, outside or both) for enhancing heat transfer, for example, to first heat transfer fluid 330, or to second heat transfer fluid 350. Such shapes can have corrugated, ribbed, or other textured surface so as to increase surface area and further improve heat transfer.

Optionally, the heat source housing 305 is placed between the first jacket of TEGs 320 and the controllable heat source 310 to protect the inner side of the jacket 320 against carbon accumulation from incomplete and/or inefficient combustion, which may happen when the natural gas does not burn completely. The heat source in housing 305 is desirably made of materials with high heat conducting properties, for example, copper, to ensure high heat transfer efficiency from the heat source 310 to the first jacket 320.

Figure 3B:
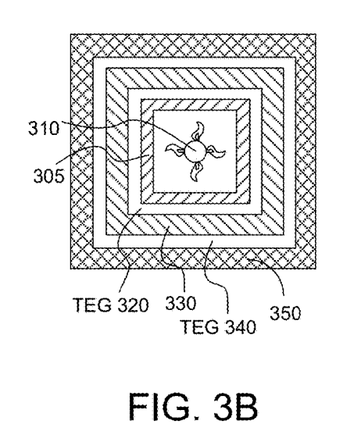
FIG. 3B illustrates a cross section view of the embodiment shown in FIG. 3A.

FIG. 3B illustrates a cross section view of the embodiment 300 shown in FIG. 3A. As illustrated in FIG. 3A, the optional heat source housing 305, the first jacket of TEGs 320, the first heat conducting fluid 330, the second jacket of TEGs 340, and the second heat conducting fluid 350, are all placed in proximity to the controllable heat source 310 so as to at least partially surround the heat source 310 for better heat-to-electricity conversion efficiency. It is noted that proper seals are omitted from FIGS. 3A and 3B for simplicity; however, a person having ordinary skill in the art will understand that any suitable seals or enclosures with high heat conductivity can be used to properly contain the heat conducting fluids. It is further noted that the number of jackets of TEGs and layers of heat conducting fluids are arbitrary and need not be the same. In some embodiments, the number of jackets is not equal to the number of layers of heat conducting fluids. Also shown in the embodiment of FIG. 3B is configuration where the TEGS in second jacket 340 are separated by thermally insulated wells to prevent conduction or other thermal cross talk between TEGs which may resulting in a decrease in temperature gradient ΔT.

Figure 4:
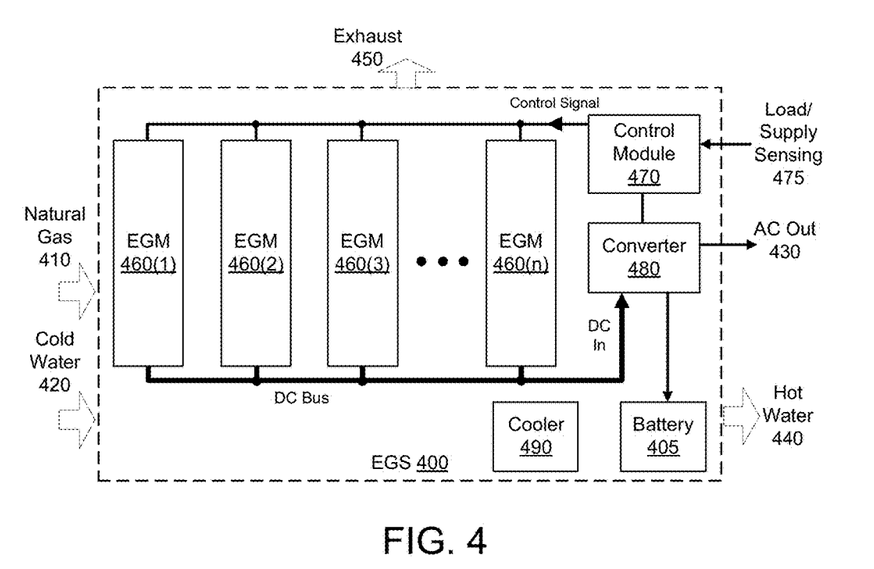
FIG. 4 illustrates a multiple module configuration for an energy generation system, according to one embodiment.

FIG. 4 illustrates a multiple module configuration for an energy generation system (EGS) 400, according to one embodiment. The EGS 400 includes a natural gas input 410, a cold water input 420, an electricity output 430, a hot water output 440, and one or more exhaust outputs 450. The energy generation system 400 also includes a plurality of thermoelectric energy generation modules (EGMs) 460(1)-460(n), a control module 470, a DC-to-AC converter 480, and a water cooler 490, and optionally, a battery 405. The plurality of EGMs 460 are coupled to the natural gas input 410 and the cold water input 420. According to present embodiments, the energy generation system 400 can control the plurality of EGMs 460 to convert heat from a controllable heat source, for example, by burning the natural gas supplied by the natural gas input 410, to electricity in a manner similar to the EGS 100 of FIG. 1 described above. The operations of the EGMs 460 are similar to the EGM 160 of FIG. 1, and are not redundantly described herein. However, the operations of the control module 470 are now explained in more details.

Referring to both FIGS. 1 and 4, the control module 470 has a load/supply sensing input 475 to monitor load/supply condition, and is coupled to the controllable heat sources of the plurality of EGMs 460 to transmit control signals. The control module 470 is configured to (i) monitor at least a load demand of the system and a supply condition of a local power grid; (ii) determine when to generate electricity and at what capacity based on the results of the monitoring; and (iii) adjust one or more heat sources of the plurality of energy generation modules based on the determination. According to some embodiments, the control module 470 can further monitor the buying prices for natural gas and electricity in making the determination on whether it is economically profitable to generate electricity, and if so, how much electricity is to be generated.

Therefore, when the power supply from the local power grid is not enough (e.g., during summer or during a power outage), the control module 470 is operable to generate electricity. That is to say, the EGS 400 can generate electricity when the load demand of the system is greater than the supply condition of the local power grid, meaning the EGS 400 is operating as a supplemental power source. Furthermore, there are certain times when it makes economic sense for the user to generate his or her own electricity from gas rather than buying electricity from the local power company. Therefore, in some embodiments, the control module 470 is operable to generate electricity when the cost of generating electricity using the EGS 400 is lower than the cost of buying electricity directly from a local power company.

Still further, in some places in North America, there are policies of repaying the users if they are to put electricity back onto the local power grid. Therefore, in some embodiments, the control module 470 further monitors a selling price for transmitting electricity back to the local power grid, and the control module 470 is operable to generate electricity when the cost of generation electricity is lower than the selling price for transmitting electricity back to the grid.

Optionally, the battery 405 can be placed in the EGS 400. The battery 405 can be used for backup and/or power supplement purposes. In specific embodiments, because there is a transition delay in the process from burning natural gas to generate heat, and then in converting the heat into electricity, the battery 405 can be configured to support the electrical power demands put on EGS 400 by users during this transition time. The battery 405 is charged when the electricity generated from the EGMs 460 is higher than the load demand, and is to release the energy when the load demand is higher than the electricity generated from the EGMs 460. For embodiments the EGS 400 having a battery 405, the control module 470 can be further configured to store electricity in the battery (e.g., by directing a charging current to the battery under a charging regime tailored to the specific battery chemistry, e.g., lead acid, lithium ion, etc) during a first transition time in which an output from the plurality of energy generation modules is higher than what is designated by the control module, and then to release electricity from the battery during a second transition time in which the output from the plurality of energy generation modules is lower than what is designated by the control module.

Therefore, the EGS 400 with control module 470 can dynamically generate electricity based, at least in part, on load/supply demand 475. The control module 470 senses load conditions and accurately controls energy generation. The control module 470 can control natural gas combustion (e.g., turn it off and on and control the rate) and/or adjust the flow rates of liquid in achieving its electricity generation targets. Advantageously, the EGS 400 can enable a user to efficiently convert natural gas into electricity.

Figure 5:
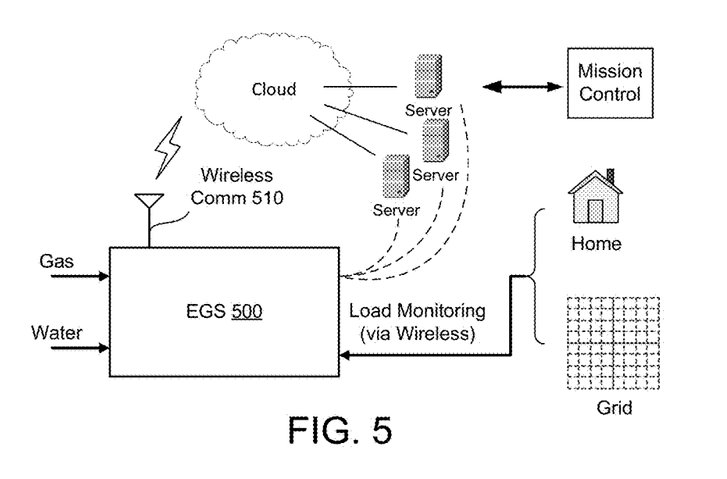
FIG. 5 illustrates an energy generation system with wireless remote control ability, according to embodiments described herein.

FIG. 5 illustrates an energy generation system 500 with wireless remote control ability, according to embodiments described herein. The EGS 500 is essentially the same as the EGS 400 of FIG. 4, except that the EGS 500 is equipped with a wireless communication circuit 510 coupled to its control module (not shown). With the wireless communication circuit 510, the control module can receive remote control commands to make adjustment to energy generation operations. The remote control commands can come from a centralized mission control, or other suitable sources including, for example, a user's personal digital assistance (PDA), personal computer, laptop, or a smart phone. In those cases in which the remote control commands come from one or more servers, the servers may accessible via the Internet (or the cloud). In other embodiments, the EGS 500 can communicate with one or more servers through wired connections such as a local area network (LAN).

Figure 6:
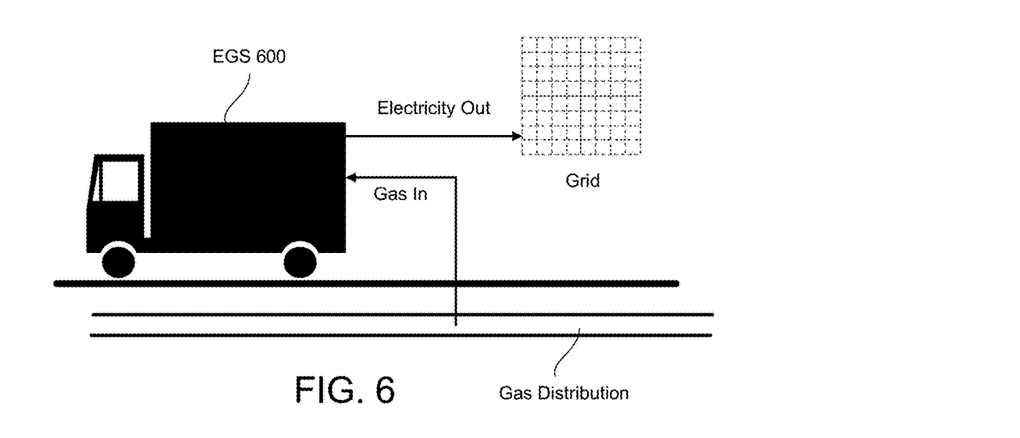
FIG. 6 illustrates a mobile application of an energy generation system, according to embodiments.

FIG. 6 illustrates a mobile application of an energy generation system 600, according to embodiments. The EGS 600 is mounted on to a mobile platform, for example, a truck. The EGS 600 is suitable for a temporary field application. For example, in a natural gas farm environment where there is an ample supply of natural gas but lack of electricity, the EGS 600 can convert natural gas into electricity for use.

Figure 7:
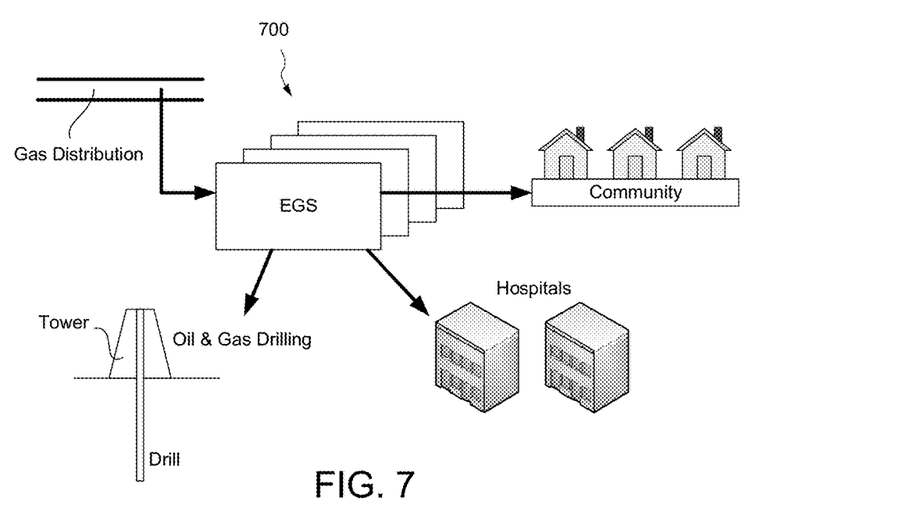
FIG. 7 illustrates a remote application of an energy generation system, according to embodiments.

FIG. 7 illustrates a remote application of an energy generation system 700, according to one or more embodiments. Similar to the application of the EGS 600 of FIG. 6, one or more EGS(s) 700 can be installed at a remote site where ample supply of natural gas can be found, for example, a natural gas farm, sewage plant, farm, or an oil drilling platform. In use, the EGS 700 can convert natural gas found in such areas into electricity for use by consumers.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An energy generation system for providing electrical energy via an electricity output in communication with a local power grid, comprising:
   multiple energy generation modules for converting thermal energy into the electrical energy;
   a DC-to-AC converter including the electrical output, the DC-to-AC converter being directly coupled to a jacket of thermoelectric devices disposed in each energy generation module of the multiple energy generation modules, the local power grid being located external to the energy generation system;
   a cold water input to admit cold water in to the energy generation system so that the cold water flows within the generation system to cool the jacket of thermoelectric devices in each energy generation module of the multiple energy generation modules during operation of the energy generation system; and
   a control module being directly coupled to each controllable heat source of the multiple energy generation modules via a control line, the control module being in communication with the local power grid, the control line being configured to carry a control signal generated by the control module; and
   each energy generation module of the multiple energy generation modules comprises:
      the controllable heat source configured to receive the control signal;
      the jacket of thermoelectric devices having a textured inner side and an outer side, the textured inner side of the jacket of thermoelectric devices surrounding the controllable heat source and being thermally coupled to the controllable heat source via a heat conducting fluid interposed and enclosed between the controllable heat source and the jacket of thermoelectric devices; and
   the control module further being configured to:
      (i) monitor at least a load demand of the energy generation system and a power supply condition of the local power grid;
      (ii) determine whether an amount of heat of the at least one of the controllable heat sources of the multiple energy generation modules should be adjusted to modify the electricity output at the DC-to-AC converter and capacity of the energy generation system which would alter an amount of the electrical energy to be supplied to the local power grid from the energy generation system based on the monitoring; and
      (iii) adjust the heat generated by the at least one of the controllable heat sources of the multiple energy generation modules based on the determination to the amount of heat by transmitting the control signal on the control line to the at least one of the controllable heat sources.

2. The energy generation system of claim 1, wherein the control module is further configured to monitor:
   a buying price for natural gas and a buying price for electrical energy available on the local power grid.

3. The energy generation system of claim 2, wherein the control module is further configured to monitor:
   a selling price for transmitting the electrical energy that is produced by the energy generation system which is output from the electricity output to the local power grid.

4. The energy generation system of claim 3, wherein the control module adjusts the at least one of the controllable heat sources of the multiple energy generation modules in response to:
  (a) determining that the load demand of the energy generation system is greater than the supply condition of the local power grid; and at least one of;
  (b) determining that the cost of generating the electricity output is lower than the buying price for the electricity output; or
  (c) determining that the cost of generating the electricity output is lower than the selling price for transmitting the electricity output back to the local power grid.

5. The energy generation system of claim 1, wherein the control module is coupled to a wireless communication circuit to receive remote control commands.

6. The energy generation system of claim 1, further comprising:
  a battery; and
  wherein the control module is further configured to:
  (iv) enable storage of the electricity output in the battery during a first transition time in which an output from the multiple energy generation modules is higher than the load demand; and
  (v) enable release of the electricity output from the battery during a second transition time in which the output from the multiple energy generation modules is lower than the load demand.

7. The energy generation system of claim 1, wherein the heat conducting fluid is oil.

8. The energy generation system of claim 1, wherein each controllable heat source is a natural gas combustor.

\* \* \* \* \*